(12) United States Patent
Bogner et al.

(10) Patent No.: US 9,054,279 B2
(45) Date of Patent: Jun. 9, 2015

(54) OPTOELECTRONIC COMPONENT DISPOSED IN A RECESS OF A HOUSING AND ELECTRICAL COMPONENET DISPOSED IN THE HOUSING

(75) Inventors: Georg Bogner, Lappersdorf (DE); Stefan Gruber, Bad Abbach (DE); Thomas Zeiler, Nittendorf (DE); Markus Kirsch, Brunn (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 901 days.

(21) Appl. No.: 12/521,352

(22) PCT Filed: Jan. 9, 2008

(86) PCT No.: PCT/DE2008/000029
§ 371 (c)(1), (2), (4) Date: Jun. 26, 2009

(87) PCT Pub. No.: WO2008/083672
PCT Pub. Date: Jul. 17, 2008

(65) Prior Publication Data
US 2011/0002587 A1      Jan. 6, 2011

(30) Foreign Application Priority Data
Jan. 11, 2007  (DE) .......................... 10 2007 001 706

(51) Int. Cl.
| | |
|---|---|
| G02B 6/00 | (2006.01) |
| G02B 6/14 | (2006.01) |
| H01L 33/48 | (2010.01) |
| H01L 25/16 | (2006.01) |
| H01L 25/075 | (2006.01) |
| H01L 33/60 | (2010.01) |

(52) U.S. Cl.
CPC .......... *H01L 33/483* (2013.01); *H01L 25/0753* (2013.01); *H01L 25/167* (2013.01); *H01L 33/60* (2013.01); *H01L 2224/48247* (2013.01); *H01L 2224/73265* (2013.01); *H01L 2224/48464* (2013.01); *H01L 2224/48091* (2013.01)

(58) Field of Classification Search
USPC ............... 385/14, 88, 89, 90, 92, 93, 94, 147; 257/98, E33.067
See application file for complete search history.

(56) References Cited

U.S. PATENT DOCUMENTS

| | | |
|---|---|---|
| 5,581,076 A | 12/1996 | Tabata |
| 5,897,338 A * | 4/1999 | Kaldenberg .................. 438/116 |
| 6,603,183 B1 | 8/2003 | Hoffman |
| 6,610,563 B1 | 8/2003 | Waitl et al. |
| 6,657,382 B2 | 12/2003 | Nagai et al. |
| 6,900,511 B2 | 5/2005 | Ruhnau et al. |

(Continued)

FOREIGN PATENT DOCUMENTS

| | | |
|---|---|---|
| CN | 101030572 A | 9/2007 |
| DE | 84 24 611.1 U1 | 7/1989 |

(Continued)

*Primary Examiner* — Akm Ullah
(74) *Attorney, Agent, or Firm* — Slater & Matsil, L.L.P.

(57) ABSTRACT

A plastic housing is arranged on a carrier element and is provided with a recess in which an optoelectronic component is arranged. On the side facing away from the carrier element, the recess has an opening to the outside which can be provided with a transparent cover. One or more structures can be provided on the plastic housing in order to orient the cover and/or optical components relative to the optoelectronic component.

17 Claims, 4 Drawing Sheets

(56) References Cited

U.S. PATENT DOCUMENTS

| | | | |
|---|---|---|---|
| 7,021,833 B2 * | 4/2006 | Loh et al. ............... 385/88 |
| 7,045,905 B2 | 5/2006 | Nakashima |
| 7,414,269 B2 | 8/2008 | Grotsch et al. |
| 7,427,806 B2 * | 9/2008 | Arndt et al. ............. 257/682 |
| 7,501,660 B2 | 3/2009 | Schmid et al. |
| 7,719,680 B2 * | 5/2010 | Christian et al. ........ 356/319 |
| 8,026,526 B2 | 9/2011 | Weber-Rabsilber et al. |
| 8,227,821 B2 | 7/2012 | Bogner et al. |
| 8,314,441 B2 | 11/2012 | Ruhnau et al. |
| 8,476,655 B2 | 7/2013 | Brunner et al. |
| 2002/0039001 A1 | 4/2002 | Nagai et al. |
| 2002/0163001 A1 | 11/2002 | Shaddock |
| 2003/0231833 A1 * | 12/2003 | Lerner et al. ............ 385/49 |
| 2004/0037076 A1 | 2/2004 | Katoh et al. |
| 2004/0075100 A1 | 4/2004 | Bogner et al. |
| 2004/0201987 A1 | 10/2004 | Omata |
| 2004/0256706 A1 | 12/2004 | Nakashima |
| 2005/0121686 A1 | 6/2005 | Keller et al. |
| 2005/0180698 A1 | 8/2005 | Hauffe et al. |
| 2006/0006793 A1 | 1/2006 | Baroky et al. |
| 2006/0022215 A1 | 2/2006 | Arndt et al. |
| 2006/0027479 A1 | 2/2006 | Auburger et al. |
| 2006/0234409 A1 | 10/2006 | Nagai et al. |
| 2006/0267040 A1 | 11/2006 | Baek et al. |
| 2007/0001177 A1 | 1/2007 | Bruning et al. |
| 2007/0194422 A1 | 8/2007 | Lai et al. |
| 2007/0253667 A1 | 11/2007 | Brunner et al. |
| 2007/0257901 A1 | 11/2007 | Gotou et al. |
| 2008/0038853 A1 | 2/2008 | Park et al. |
| 2008/0224159 A1 | 9/2008 | Krauter et al. |
| 2008/0265266 A1 | 10/2008 | Bogner et al. |
| 2009/0212316 A1 | 8/2009 | Braune et al. |
| 2009/0236625 A1 | 9/2009 | Yen et al. |
| 2009/0261365 A1 | 10/2009 | Brunner et al. |
| 2009/0267107 A1 | 10/2009 | Weber-Rabsilber et al. |
| 2011/0002587 A1 | 1/2011 | Bogner et al. |

FOREIGN PATENT DOCUMENTS

| | | |
|---|---|---|
| DE | 196 00 678 A1 | 7/1997 |
| DE | 197 55 734 A1 | 6/1999 |
| DE | 101 17 889 A1 | 10/2002 |
| DE | 10229067 A1 | 1/2004 |
| DE | 103 40 069 A1 | 4/2004 |
| DE | 203 06 928 U1 | 6/2004 |
| DE | 103 24 909 A1 | 1/2005 |
| DE | 10 2004 029 507 A1 | 3/2005 |
| DE | 10 2004 031 391 A1 | 1/2006 |
| DE | 10 2004 045 950 A1 | 3/2006 |
| DE | 102005041064 A1 | 3/2007 |
| DE | 102006004397 A1 | 4/2007 |
| EP | 1 622 237 A1 | 2/2006 |
| JP | 59-132147 A | 7/1984 |
| JP | 05-037021 A | 2/1993 |
| JP | 0550754 U | 7/1993 |
| JP | 08287719 A | 11/1996 |
| JP | 0983018 A | 3/1997 |
| JP | 10284759 A | 10/1998 |
| JP | 2001210840 A | 8/2001 |
| JP | 2002223005 A | 8/2002 |
| JP | 2002232014 A | 8/2002 |
| JP | 2003-008075 A | 1/2003 |
| JP | 200386846 A | 3/2003 |
| JP | 2004-111964 A | 4/2004 |
| JP | 2005-093896 A | 4/2005 |
| JP | 2005512331 A | 4/2005 |
| JP | 2005217094 A | 8/2005 |
| JP | 2005-322680 A | 11/2005 |
| JP | 2006-093697 A | 4/2006 |
| JP | 2006-516816 A | 7/2006 |
| JP | 2006216887 A | 8/2006 |
| JP | 2006-294982 A | 10/2006 |
| JP | 2007227882 A | 9/2007 |
| JP | 2007324330 A | 12/2007 |
| KR | 1020070000638 A | 1/2007 |
| TW | I237546 B | 8/2005 |
| WO | WO 2004/068594 A1 | 8/2004 |
| WO | WO 2005/093853 A1 | 10/2005 |
| WO | WO 2005/104248 A1 | 11/2005 |
| WO | 2006032251 A1 | 3/2006 |
| WO | WO 2006/111907 A2 | 10/2006 |
| WO | WO 2006/114082 A2 | 11/2006 |
| WO | WO 2008/031391 A1 | 3/2008 |
| WO | 2008074286 A1 | 6/2008 |
| WO | 2008083672 A2 | 7/2008 |

* cited by examiner

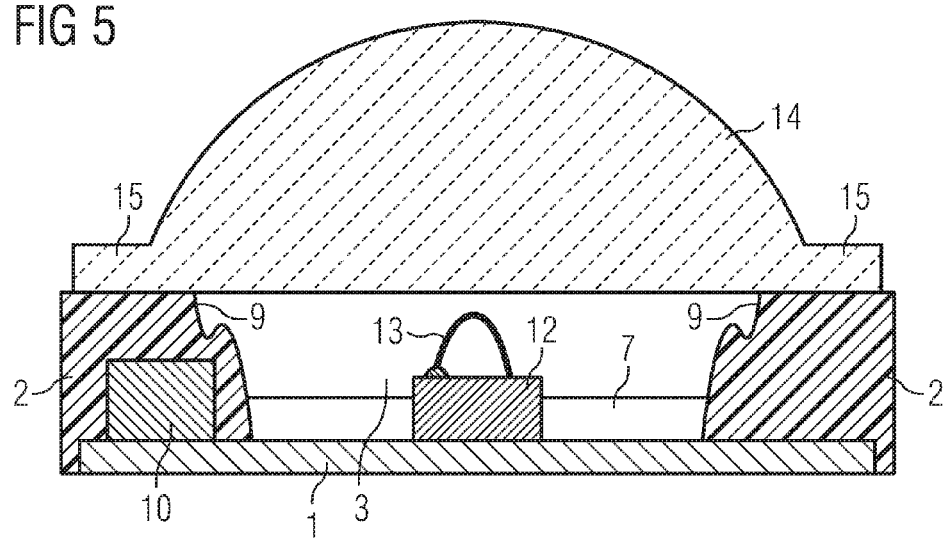
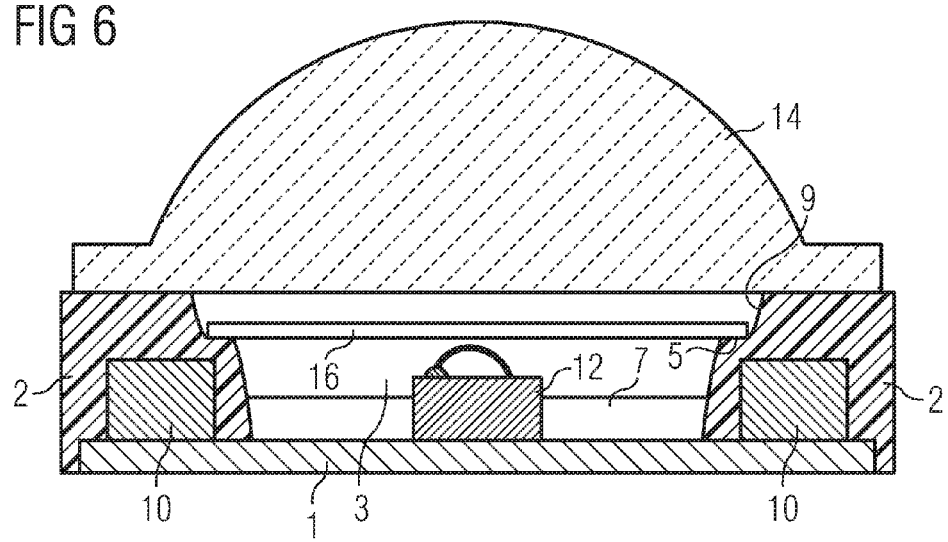

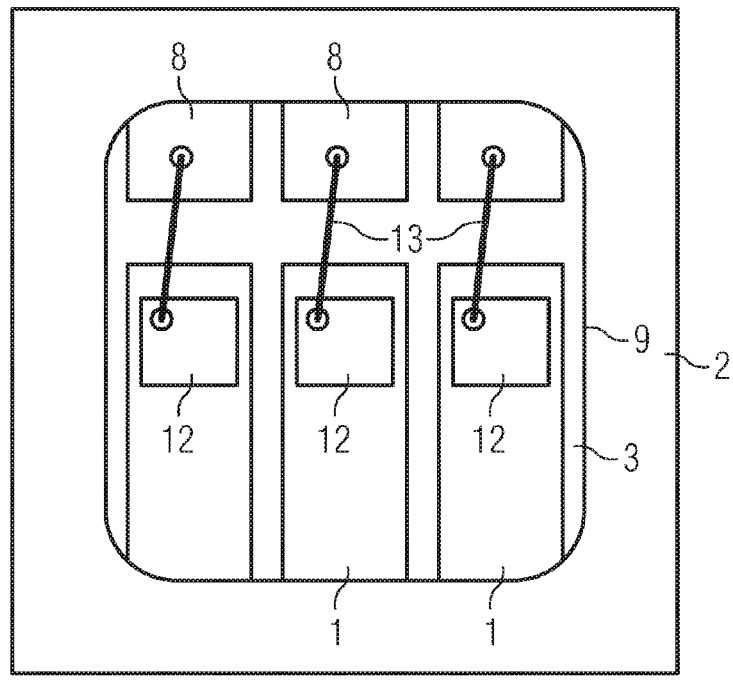
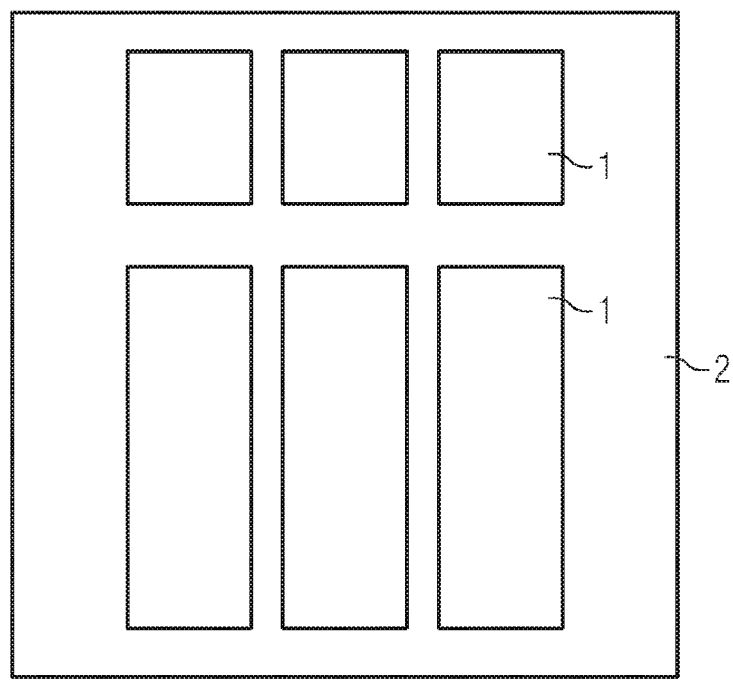

OPTOELECTRONIC COMPONENT DISPOSED IN A RECESS OF A HOUSING AND ELECTRICAL COMPONENET DISPOSED IN THE HOUSING

This patent application is a 371 filing of PCT/DE2008/000029, filed Jan. 9, 2008, which claims the priority of German patent application 10 2007 001 706.7, filed Jan. 11, 2007, the disclosure content of which is hereby incorporated by reference.

TECHNICAL FIELD

The present invention relates to a housing for an optoelectronic component, which can be used, for example, as a lens component for light-emitting diodes.

BACKGROUND

A number of different housings are used for electronic components. Semiconductor chips are frequently mounted on patterned metallic carriers, so-called leadframes, and are injected into a potting composition. In the case of so-called QFN (Quad Flat No Lead) components, a flat square thermosetting plastic body, which is opaque, is used as the housing. A transparent housing comprising a thermoplastic material can be used for optoelectronic components. A conversion element, which is intended to modify the emitted light, is directly fitted to the chip of the optoelectronic component when such housings are used, for example, for light-emitting diodes (LED).

SUMMARY

In one aspect, the present invention specifies a housing for optoelectronic components that can be combined with optical components better than previous housings. In particular, a light-emitting diode mounted in the housing is intended to have a low thermal resistance and high thermal stability and is intended to be able to be expediently provided with a conversion element.

The housing has a carrier element on which a plastic housing is arranged, wherein the plastic housing can be a thermosetting plastic and can be opaque, in particular. The plastic housing is provided with a recess which is intended to accommodate an optoelectronic component and has an opening to the outside on the side facing away from the carrier element. An optoelectronic component is arranged inside the recess with a region that is intended for light emission or light reception oriented towards the opening. The recess can be filled with a transparent filling material, in particular after the optoelectronic component has been mounted. A transparent cover of the recess can be arranged in the region of the opening, in particular at a distance from an optoelectronic component arranged in the recess. The cover may be, for example, a transparent lid comprising glass or plastic or else a lens or an arrangement of different optical components.

A conversion element for modifying the light can be arranged in the recess, in particular in the case of applications for light-emitting diodes. The form of the housing allows the conversion element to be arranged at a suitable distance from the light-emitting top side of the component. The conversion element can be provided for the purpose of changing the color of the light. It is preferably as thin as possible, preferably spans the entire solid angle range determined by the opening of the recess and is preferably arranged such that it is not in direct contact with the optoelectronic component. This ensures that the light emitted in various directions covers approximately the same distance when crossing the conversion element and consequently has a similar color temperature irrespective of the emission direction.

Structures or mounting openings may be provided on the plastic housing, wherein the structures or mounting openings are provided separately and define the arrangement of a cover or optical components relative to the plastic housing and thus make it possible to easily mount a cover or optical components and to precisely orient them relative to the plastic housing. In order to mount the optoelectronic component, in particular a light-emitting diode (LED), a chip island or the like may be provided on the carrier element on the side facing the recess. In order to orient the optoelectronic component, additional structure elements may be provided on the carrier element.

The optoelectronic component is preferably electrically connected using a metal carrier element and suitable patterning of the carrier element. The carrier element is then, for example, a patterned metal layer, for example, a leadframe which is known per se and is subdivided into separate parts which are electrically insulated from one another. Such a carrier element may comprise copper, for example. The optoelectronic component is then contact-connected on the chip island of the carrier element, for example, via a rear-side contact. A bonding wire which electrically conductively connects a corresponding connection contact of the optoelectronic component to a further part of the carrier element may be provided, for example, for the purpose of further electrical connection. The various parts of the patterned metal carrier element thus form the external electrical connection on the housing. In this embodiment, the housing does not need to be provided with strip-type connection conductors ("connection pins") which are routed to the outside (no leads). The rear-side contact areas of the carrier element can be soldered to a printed circuit board or the like, for example, for the purpose of external electrical connection.

The material of the plastic housing is preferably matched to the material of the carrier element with regard to the coefficient of thermal expansion and the adhesion properties. As a result of the combination with a plastic housing comprising a suitable material, it is possible to use, as the carrier element, a planar metallic leadframe which is only stamped or etched and nevertheless has high mechanical stability in combination with the plastic housing. Further electronic components, in particular in the form of ESD protection or drive components, may be arranged inside the plastic housing, for example, injected into the plastic material of the plastic housing.

This form of housing allows an arrangement of optoelectronic components in a housing, which arrangement is mechanically and thermally stable and can also be provided with different further optical and/or electrical components.

BRIEF DESCRIPTION OF THE DRAWINGS

A more precise description of examples of the housing the accompanying figures follows.

FIG. 5 shows the further cross section marked in FIG. 1 for a further exemplary embodiment.

FIG. 6 shows a cross section corresponding to FIG. 5 for a further exemplary embodiment.

FIG. 7 shows a plan view of a further exemplary embodiment of the housing.

FIG. 8 shows a rear-side plan view of the exemplary embodiment according to FIG. 7.

DETAILED DESCRIPTION

Figure 1:
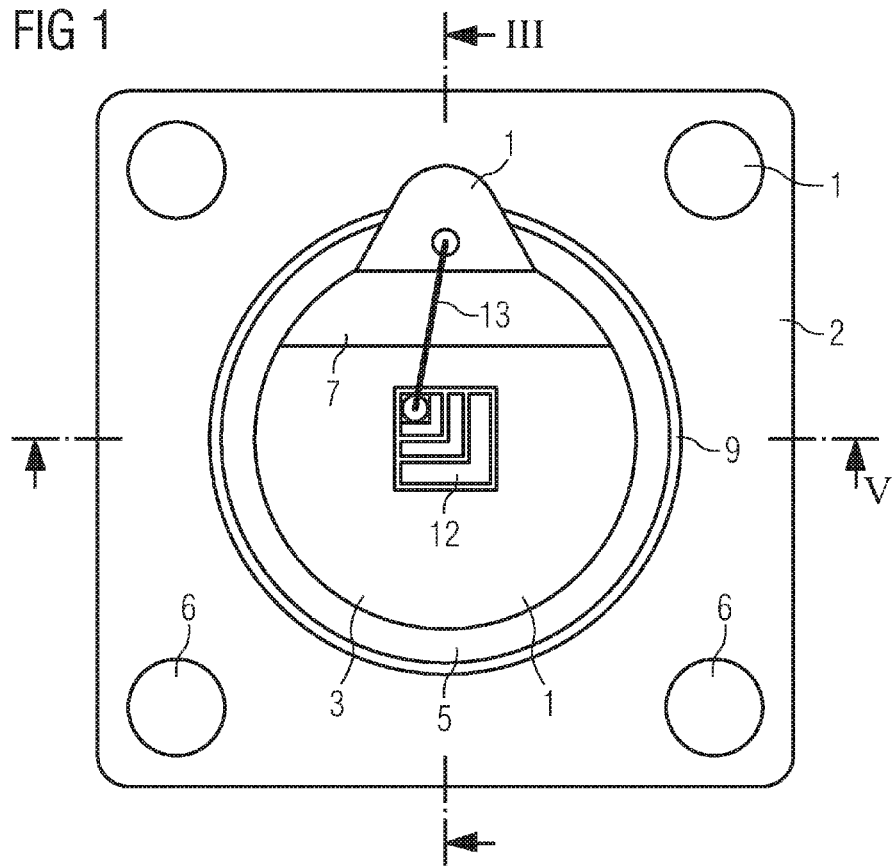
FIG. 1 shows a plan view of one exemplary embodiment of the housing.

FIG. 1 shows a plan view of one exemplary embodiment of the housing. A plastic housing 2 is fitted to a carrier element 1. The plastic housing has recesses through which parts of the carrier element 1 can be seen from above in the viewing direction represented in FIG. 1. These recesses may also be omitted in so far as they are not intended to accommodate an optoelectronic component but rather constitute only mounting aids. They need not extend to the top side of the carrier element 1 either.

The plastic housing 2 may be opaque, for example, black, and may be, in particular embodiments, a thermosetting plastic as is used, for example, in conventional QFN housings. The plastic housing 2 has a recess 3 which is preferably axially symmetrical, at least approximately cylindrical in the exemplary embodiment illustrated, but may, in principle, have any desired geometrical form. On the side facing away from the carrier element 1, the recess has an opening 9 to the outside, through which light can pass.

An optoelectronic component 12 is arranged above the carrier element 1 inside the recess 3. The optoelectronic component 12 may be directly arranged on a chip island of the carrier element 1, for example. In this case, first electrical connection to the carrier element 1 is preferably effected using a rear-side contact of the optoelectronic component 12. In the example illustrated in FIG. 1, further electrical connection is formed by a bonding wire 13 which connects a connection contact of the optoelectronic component 12 to a connection area of a further part of the carrier element. In the example illustrated, the parts of the carrier element 1 are separated and electrically insulated from one another by a web 7, which is not necessarily present. This web 7 is able to be formed by a part of the plastic housing 2.

A structure 5 of the plastic housing 2 can be provided so that a cover or an optical component, for example, a conversion element, can be oriented precisely relative to the plastic housing 2 on the recess 3 or so that better adhesion of a transparent potting composition is achieved. Mounting openings 6 or grooves into which, for example, pins or similar extensions, which are fitted to the relevant optical component, are fitted can be additionally fitted in the plastic housing 2 for optical components which are provided in a cover. The optoelectronic component 12 may be, for example, a light-emitting diode (LED) or another light-emitting component. It is likewise possible to arrange a photodetector in the housing.

Figure 2:
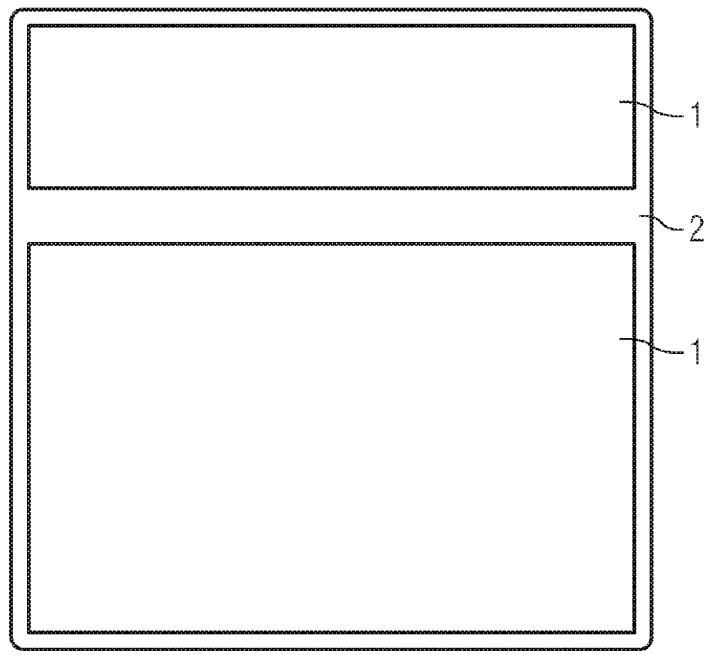
FIG. 2 shows a rear-side plan view of the exemplary embodiment according to FIG. 1.

FIG. 2 shows a rear view of the housing of the exemplary embodiment of FIG. 1. In the simple example illustrated, the carrier element 1 has two parts that are separated from one another and are electrically insulated from one another. The larger part illustrated at the bottom of FIG. 2 has the chip island on which the optoelectronic component is arranged inside the recess. That part of the carrier element 1 which is depicted at the top of FIG. 2 acts as a further electrical connection and is connected to the bonding wire 13 inside the recess 3 in the exemplary embodiment described, as illustrated in FIG. 1.

Figure 3:
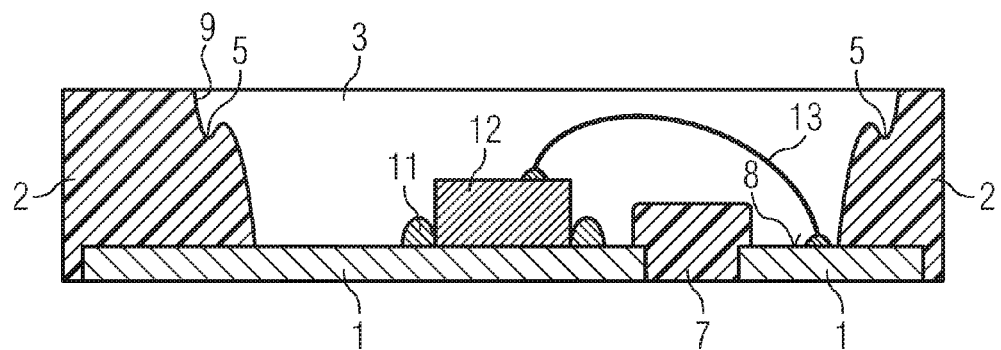
FIG. 3 shows the cross section marked in FIG. 1.

FIG. 3 shows the cross section III through the housing, which is marked in FIG. 1, and the optoelectronic component which is arranged in said housing but is represented only diagrammatically. It can easily be seen in FIG. 3 that the carrier element 1 comprises two separate parts in this exemplary embodiment. If required, the recess 3 can be filled with a transparent filling material. A transparent potting composition, for example, silicone, an epoxy resin or a hybrid material (silicone epoxide) is suitable for this purpose, for example. In this example, the structure 5 provided in the plastic housing 2 is a type of lateral groove in the inner wall of the recess 3, which is used for better adhesion of the potting composition.

FIG. 3 also illustrates a structure element 11 which can be fitted to the carrier element 1 and is provided for more accurate positioning of the optoelectronic component 12. The web 7 which is illustrated by way of example in FIG. 1 and is fitted for the purpose of restricting the parts of the carrier element 1 in this embodiment is shown in cross section in FIG. 3. One end of the bonding wire 13 present in this example is fastened to a contact area on the top side of the optoelectronic component 12 and the other end is fastened to the connection area 8 of the second part of the carrier element 1. The arrangement illustrated reveals that a surface-emitting component is preferably suitable for mounting in this housing. However, with suitably modified mounting, for example, at right angles to the surface of the carrier element 1, an edge-emitting component may also be used in conjunction with this housing.

Figure 4:
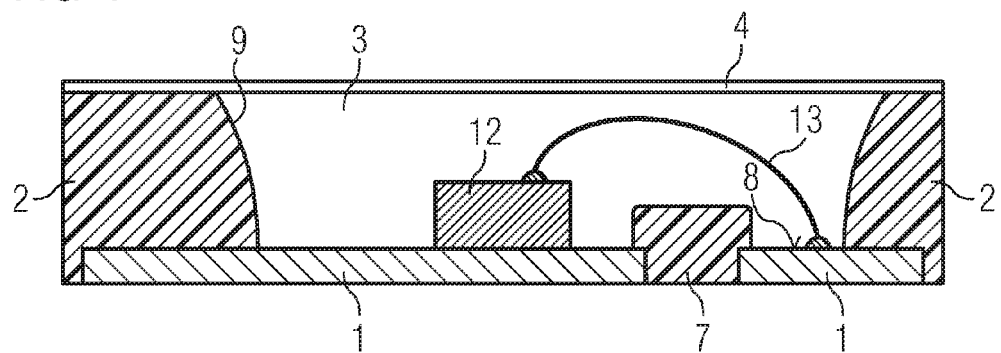
FIG. 4 shows a cross section corresponding to FIG. 3 for a further exemplary embodiment.

In the further exemplary embodiment illustrated in FIG. 4, a cover 4 of the opening 9 is provided on that side of the recess 3 that faces away from the carrier element 1. In this example, the cover 4 is a transparent layer comprising a mechanically stable material, for example, transparent plastic or glass, and is laterally fastened, for example, adhesively bonded, to the plastic housing 2. Instead of this simple transparent lid, any desired optical component or an arrangement of a plurality of optical components may be provided as the cover 4. The cover 4 may thus comprise any desired optical system which is known per se, for example, for reflection or diffraction, also in combination with one another, which system can be easily fastened to the plastic housing 2. This is a particular advantage of this design of housing. If a cover 4 is provided, it is possible to dispense with a filling material in the recess 3, in particular.

For a cover 4, for example, a transparent lid, a lens or other optical components, use is preferably made of a material which withstands the high temperatures required for a subsequent soldering process, which is used to produce external electrical connections of the housing, without damage. Therefore, in the case of such applications of the housing, optical components used in the cover 4 should be made, in particular, from material which can be subjected to reflow soldering, for example, silicone or glass.

FIG. 5 shows the further cross section V marked in FIG. 1 for a further exemplary embodiment in which the opening 9 of the recess 3 is covered with a lens 14. In conjunction with the lens 14, the recess 3 is preferably filled with a suitable filling material but the filling material may also be omitted in this exemplary embodiment. The lens may also be formed as part of the filling material. Instead of this, the lens may be cast or molded on. The lens may also comprise glass or a transparent plastic. The edge-side part 15 of the lens 14, which is illustrated in FIG. 5 and rests on the plastic housing 2, is preferably provided with nubs or pins which engage in the mounting openings 6 illustrated in FIG. 1, with the result that the lens 14 is automatically arranged in the exactly aligned position during mounting.

FIG. 5 also illustrates that at least one further electronic component 10, which has the plastic material of the plastic housing 2 injection-molded around it, for example, may be arranged in the plastic housing 2. The further electronic component 10 can be electrically connected using, for example, a suitably patterned part of a metal carrier element 1 and/or using bonding wires which, if necessary, can also be routed out of the plastic housing 2. In this manner, outputs and/or inputs of the further electronic component can be connected to connections of the optoelectronic component which are provided for this purpose. The further electronic component 10 may contain, for example, a protection circuit for protecting against damage caused by electrostatic charging (ESD, electrostatic damage). Instead of this or in addition to this, it may contain a drive circuit for the optoelectronic component (for example, an ASIC). A plurality of further electronic components may also be arranged in the plastic housing 2. This results in an abundance of different possible applications of this housing. The method of operation of the optoelectronic component 12 is not influenced or impaired at all by arranging one or more further electronic components inside the plastic housing 2. In particular, the presence of an electronic component inside the plastic housing 2 does not give rise to absorption or deflection of the radiation, and an axially symmetrical configuration of the recess 3 and resultant axially symmetrical light emission are possible without problems.

FIG. 6 illustrates a cross section of a further exemplary embodiment, which corresponds to FIG. 5, in which a conversion element 16 is arranged in the recess 3. As a mounting aid for the conversion element 16, the structure 5 of the plastic housing 2 may be formed, in particular, as a step, so that the conversion element 16 can be oriented precisely with respect to the plastic housing 2 and can be mounted at the intended distance from the optoelectronic component 12. The conversion element 16 is preferably as thin as possible and preferably covers the entire recess 3. It preferably does not have a direct connection to the surface of the optoelectronic component 12, that is to say it is not directly mounted on the surface of the latter. As a result, light propagation to or from the optoelectronic component 12 can be effected with a practically direction-independent change by the conversion element 16. If the housing is intended for an LED, such an arrangement of the conversion element 16 can be used to ensure, in particular, that the light emitted in different directions crosses the conversion element 16 at an at least approximately identical angle and covers a comparable distance, with the result that the light emerging from the housing 2 consequently has a similar color temperature over the entire solid angle range detected. In addition, the distance between the conversion element 16 and the optoelectronic component 12 can be optimized, with the result that, in particular, the intended light focusing or the size of the solid angle range detected by the emitted light can be set in the desired manner, if appropriate also independently of the size of the opening 9 of the recess 3. The design of housing thus allows the arrangement comprising the optoelectronic component 12 and the conversion element 16 to be optimized in accordance with the respective requirements. When use is made of a filling material which is used to fill the recess 3, the conversion element 16 can be fixed at the intended distance from the optoelectronic component 12, for example, by first of all introducing the filling material into the recess 3 up to a particular level, arranging the conversion element 16 on this part of the filling material and finally introducing the remaining filling material and enclosing the conversion element 16 in it.

In the exemplary embodiment according to FIG. 6, two further electronic components 10 are situated inside the plastic housing 2 in the cross section illustrated. This is intended to illustrate that a plurality of electronic components 10 can be arranged, in the plastic housing 2, on the same side of the plastic housing 2 or else on different sides.

FIG. 7 shows a further exemplary embodiment of the housing 2 in a plan view corresponding to FIG. 1. In this exemplary embodiment, the carrier element 1 has been subdivided into a plurality of parts, with the result that a plurality of optoelectronic components 12 can be arranged on the carrier element and can be electrically connected. In the exemplary embodiment illustrated, three optoelectronic components 12, for example, light-emitting diodes, are arranged in the recess 3. Each optoelectronic component 12 is arranged on a separate part of the carrier element 1 and is connected to a separate connection area 8 by means of a respective bonding wire 13. The shape of the opening 9 is matched to the arrangement of a plurality of optoelectronic components 12. The number of optoelectronic components 12 mounted is restricted by the size of the components and the size of the recess 3 but is otherwise arbitrary.

FIG. 8 shows the exemplary embodiment according to FIG. 7 in a rear-side view which corresponds to FIG. 2 and in which the subdivision of the carrier element 1 into the separate parts can be seen.

The different electronic and optical components used in conjunction with the housing can be mounted in a simple manner. The use of optical systems which are stable during soldering allows a high-quality connection to the plastic housing before the housing is mounted on a printed circuit board or the like, for example, and solder contacts are produced. Since the housing can have very small dimensions, the optical systems can likewise be small and the production costs can be reduced. The housing can have virtually any desired dimensions, with the result that, in particular, its overall height can be matched to the size of the optoelectronic component.

The invention claimed is:

1. A housing for an optoelectronic component, the housing comprising:
    a planar carrier element having a front side and a rear side, the rear side of the carrier element including contact surfaces for external electrical connection;
    a plastic housing arranged on the front side and side surfaces of the carrier element, wherein the carrier element has no leads leading outside of the plastic housing;
    a recess in the plastic housing, the recess having dimensions that allow the optoelectronic component to be accommodated, and the recess having an opening on a side facing away from the carrier element; and
    an electronic component arranged on the front side of the carrier element and encapsulated within the plastic housing.

2. The housing according to claim 1, further comprising a transparent cover over the opening of the recess.

3. The housing according to claim 2, wherein the transparent cover comprises a lens.

4. The housing according to claim 1, further comprising a transparent filling material in the recess.

5. The housing according to claim 4, wherein the plastic housing is provided with a structure for adhesion of the transparent filling material.

6. The housing according to claim 1, wherein the carrier element comprises a patterned metal layer.

7. The housing according to claim 1, wherein the plastic housing comprises a thermosetting plastic.

8. The housing according to claim 1, wherein the plastic housing is provided with a structure or a mounting opening that defines an arrangement of a cover or an optical component relative to the plastic housing.

9. The housing according to claim 1, wherein the carrier element has a chip island or a structure element to accommodate the optoelectronic component inside the recess.

10. An optoelectronic device comprising:
- a planar carrier element having a front side and a rear side, the rear side of the carrier element including contact surfaces for external electrical connection;
- a plastic housing arranged on the front side and side surfaces of the carrier element, wherein the carrier element has no leads leading outside of the plastic housing;
- a recess having an opening in the plastic housing;
- an optoelectronic component arranged on the front side of the planar carrier element and inside the recess, the optoelectronic component having a region for light emission or light reception oriented towards the opening; and
- an electronic component disposed within the plastic housing and electrically connected to the carrier element.

11. The device according to claim 10, wherein the optoelectronic component comprises a light-emitting diode.

12. The device according to claim 10, further comprising a conversion element arranged between the opening of the recess and the optoelectronic component.

13. The device according to claim 12, wherein the conversion element is configured to change light propagation to or from the optoelectronic component arranged in the recess in a direction-independent manner.

14. The device according to claim 10, wherein the further electronic component contains a protection circuit for protecting against damage caused by electrostatic charging.

15. The device according to claim 10, wherein the further electronic component contains a drive circuit for the optoelectronic component.

16. The device according to claim 10, further comprising at least one further optoelectronic component arranged inside the recess, each further optoelectronic component having a region for light emission or light reception oriented towards the opening.

17. The device according to claim 16, wherein each further optoelectronic component comprises a light-emitting diode.

* * * * *

UNITED STATES PATENT AND TRADEMARK OFFICE
CERTIFICATE OF CORRECTION

PATENT NO.        : 9,054,279 B2  
APPLICATION NO.   : 12/521352  
DATED             : June 9, 2015  
INVENTOR(S)       : Georg Bogner et al.

Page 1 of 1

It is certified that error appears in the above-identified patent and that said Letters Patent is hereby corrected as shown below:

On the Title Page, Item (54), and in the Specification, Column 1, line 3, delete "Electrical Componenet Disposed In" and insert --Electrical Component Disposed In--.

Signed and Sealed this  
Twenty-fourth Day of November, 2015

Michelle K. Lee  
*Director of the United States Patent and Trademark Office*